(12) United States Patent  
Kim et al.

(10) Patent No.: US 9,105,601 B2
(45) Date of Patent: Aug. 11, 2015

(54) POWER MODULE PACKAGE

(71) Applicant: SAMSUNG ELECTRO-MECHANICS CO., LTD., Suwon (KR)

(72) Inventors: Tae Hyun Kim, Suwon (KR); Do Jae Yoo, Suwon (KR); Bum Seok Suh, Suwon (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 56 days.

(21) Appl. No.: 14/106,107

(22) Filed: Dec. 13, 2013

(65) Prior Publication Data

US 2014/0167239 A1 Jun. 19, 2014

(30) Foreign Application Priority Data

Dec. 14, 2012 (KR) .......................... 10-2012-0146347

(51) Int. Cl.
| | |
|---|---|
| H01L 23/40 | (2006.01) |
| H01L 23/492 | (2006.01) |
| H01L 23/64 | (2006.01) |
| H01L 23/373 | (2006.01) |
| H01L 23/433 | (2006.01) |
| H01L 23/495 | (2006.01) |
| H01L 23/498 | (2006.01) |
| H01L 23/053 | (2006.01) |
| H01L 23/31 | (2006.01) |

(52) U.S. Cl.
CPC ........ *H01L 23/3735* (2013.01); *H01L 23/4334* (2013.01); *H01L 23/49531* (2013.01); *H01L 23/49575* (2013.01); *H01L 23/49811* (2013.01); *H01L 23/053* (2013.01); *H01L 23/3121* (2013.01); *H01L 2224/32225* (2013.01); *H01L 2224/48091* (2013.01); *H01L 2224/48137* (2013.01); *H01L 2224/48227* (2013.01); *H01L 2224/48247* (2013.01); *H01L 2224/73265* (2013.01); *H01L 2924/1305* (2013.01); *H01L 2924/13034* (2013.01); *H01L 2924/13055* (2013.01); *H01L 2924/13091* (2013.01)

(58) Field of Classification Search
CPC ........................... H01L 23/5223; H01L 23/642
USPC ................................................ 257/700, 706
See application file for complete search history.

(56) References Cited

U.S. PATENT DOCUMENTS

| | | | |
|---|---|---|---|
| 5,920,119 A | 7/1999 | Tamba | |
| 6,548,338 B2 * | 4/2003 | Bernstein et al. | 438/210 |
| 6,670,692 B1 * | 12/2003 | Shih et al. | 257/532 |
| 2004/0130849 A1 * | 7/2004 | Kurihara et al. | 361/311 |
| 2004/0239349 A1 * | 12/2004 | Yamagishi et al. | 324/754 |
| 2005/0161706 A1 * | 7/2005 | Sutardja | 257/211 |

(Continued)

*Primary Examiner* — George Fourson, III
(74) *Attorney, Agent, or Firm* — Ladas & Parry, LLP

(57) ABSTRACT

Disclosed herein is a power module package including: a substrate including a metal layer, a first insulation layer formed on the metal layer, a first circuit pattern formed on the first insulation layer and including a first pad and a second pad spaced apart from the first pad, a second insulation layer formed on the first insulation layer to cover the first circuit pattern, and a second circuit pattern formed on the second insulation layer and including a third pad formed on a location corresponding to the first pad and a fourth pad spaced apart from the third pad; a semiconductor chip mounted on the second circuit pattern; one end being electrically connected to the semiconductor chip, and another end protruding from the outside, wherein the first pad and the third pad, and the second pad and the fourth pad have different polarities.

15 Claims, 2 Drawing Sheets

(56) References Cited

U.S. PATENT DOCUMENTS

| | | |
|---|---|---|
| 2006/0087029 A1* | 4/2006 | Imanaka et al. ............... 257/723 |
| 2008/0017407 A1* | 1/2008 | Kawano ........................ 174/260 |
| 2008/0157209 A1* | 7/2008 | Sutardja ........................ 257/368 |
| 2008/0296697 A1* | 12/2008 | Hsu et al. ...................... 257/379 |
| 2012/0326272 A1* | 12/2012 | Rokuhara ...................... 257/532 |
| 2013/0038981 A1* | 2/2013 | Imanaka et al. ............ 361/301.4 |

* cited by examiner

POWER MODULE PACKAGE

CROSS REFERENCE TO RELATED APPLICATION

This application claims the benefit of Korean Patent Application No. 10-2012-0146347, filed on Dec. 14, 2012, entitled "Power Module Package", which is hereby incorporated by reference in its entirety into this application.

BACKGROUND OF THE INVENTION

1. Technical Field

The present invention relates to a power module package.

2. Description of the Related Art

Underground resources are limited, whereas an amount of used energy tends to increase every year. Accordingly, much interest and efforts have been devoted to development of alternative energy worldwide. Such efforts lead to development of technology that yields high efficiency at low energy. One of theses is a power module.

In general, power modules are largely classified into inverters, converters, and motor driving power modules, have a variety of shapes according to their uses, and also have gradually increasing amounts of use. Simultaneously, development of technology for a power module substrate that is a core material of a power module is required.

A core characteristic required for the power module substrate is a heat resistance characteristic. Since current of high capacity flows in a power device itself, small losses occur during switching, which causes heat.

Accordingly, power module substrates developed up to now have structures focused on the heat resistance characteristic.

However, as the development of the power module is changed to improvement of efficiency and performance, a used frequency region band gradually increases, and various elements are included in one power module other than a control unit.

Accordingly, noise occurs in a power unit or the control unit or between other elements.

Meanwhile, a conventional power module package is disclosed in U.S. Pat. No. 5,920,119.

SUMMARY OF THE INVENTION

The present invention has been made in an effort to provide a power module package for providing a power circuit with a stable ground GND, thereby preventing a high frequency current from diffusing.

Further, the present invention has been made in an effort to provide a power module package for forming a decoupling capacitor structure inside of a substrate, thereby preventing noise from occurring and propagating.

Further, the present invention has been made in an effort to provide a power module package for increasing a metal volume in a substrate, thereby improving a heat resistance characteristic.

According to a first preferred embodiment of the present invention, there is provided a power module package, including: a substrate including a metal layer, a first insulation layer formed on the metal layer, a first circuit pattern formed on the first insulation layer and including a first pad and a second pad spaced apart from the first pad, a second insulation layer formed on the first insulation layer to cover the first circuit pattern, and a second circuit pattern formed on the second insulation layer and including a third pad formed on a location corresponding to the first pad and a fourth pad spaced apart from the third pad; a semiconductor chip mounted on the second circuit pattern; and an external connection terminal having one end and another end, one end being electrically connected to the semiconductor chip, and another end protruding from the outside, wherein the first pad and the third pad, and the second pad and the fourth pad have different polarities.

The first pad and the fourth pad, and the second pad and the third pad may have the same polarity.

The substrate may include: a first via formed to electrically connect the first pad and the fourth pad; and a second via formed to electrically connect the second pad and the third pad.

The power module package may further include: a sealing member formed to surround the semiconductor chip from both sides in a thickness direction of the substrate.

The second circuit pattern may include an external connection pad spaced apart from the third pad and the fourth pad, wherein one end of the external connection terminal contacts the external connection pad.

The external connection terminal may be a lead frame.

The first insulation layer and the second insulation layer may include resin insulation materials including inorganic fillers.

According to a second preferred embodiment of the present invention, there is provided a power module package including: a substrate including a metal layer, a first insulation layer formed on the metal layer, a first circuit pattern formed on the first insulation layer and including a first pad and a second pad spaced apart from the first pad, a second insulation layer formed on the first insulation layer to cover the first circuit pattern, and a second circuit pattern formed on the second insulation layer and including a third pad formed on a location corresponding to the first pad and a fourth pad spaced apart from the third pad; a semiconductor chip mounted on the second circuit pattern; an external connection terminal having one end and another end, one end being electrically connected to the semiconductor chip, and another end protruding from the outside; and a case formed on the substrate and covering an upper portion of the substrate and the semiconductor chip, wherein the first pad and the third pad, and the second pad and the fourth pad have different polarities.

The first pad and the fourth pad, and the second pad and the third pad may have the same polarity.

The substrate may include: a first via formed to electrically connect the first pad and the fourth pad; and a second via formed to electrically connect the second pad and the third pad.

The second circuit pattern may include an external connection pad spaced apart from the third pad and the fourth pad, wherein one end of the external connection terminal contacts the external connection pad.

The first insulation layer and the second insulation layer may include resin insulation materials including inorganic fillers.

The case may include an insertion hole formed to insert another end of the external connection terminal.

The power module package may further include: a sealing member formed to cover the upper portion of the substrate and the semiconductor chip in the case.

The external connection terminal may have a pin shape.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
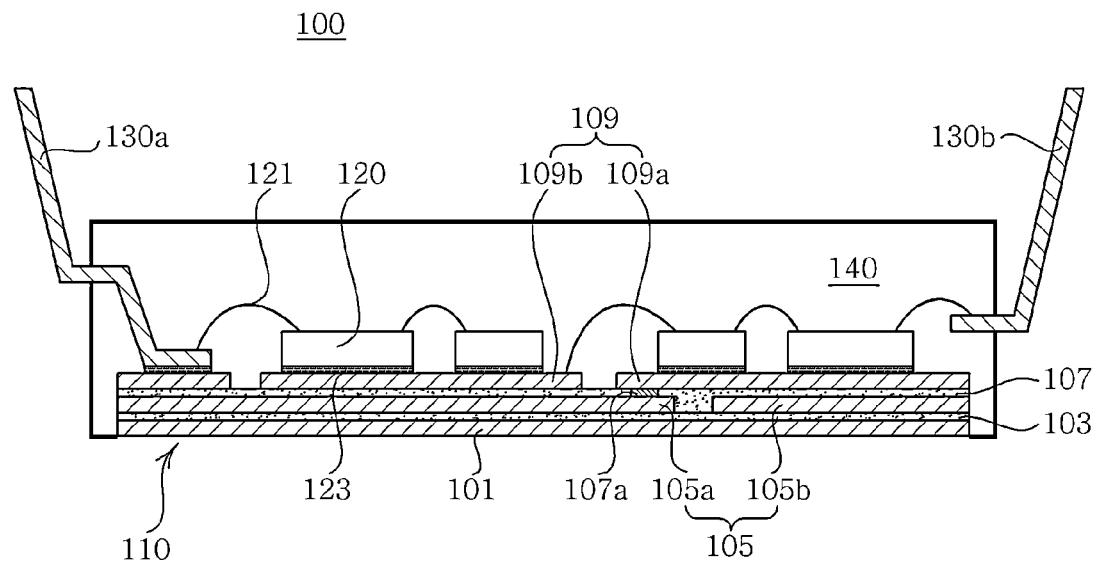
FIG. 1 is a cross-sectional view of a structure of a power module package according to a first embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

First Embodiment

FIG. 1 is a cross-sectional view of a structure of a power module package 100 according to a first embodiment of the present invention.

Referring to FIG. 1, the power module package 100 of the present embodiment includes a substrate 110, a semiconductor chip 120 mounted on the substrate 110, and an external connection terminal 130 connected onto the substrate 110.

As shown in FIG. 1, in the present embodiment, the substrate 110 may include a metal layer 101, a first insulation layer 103 formed on the metal layer 101, a first circuit pattern 105 formed on the first insulation layer 103 and including a first pad 105a and a second pad 105b spaced apart from the first pad 105a, a second insulation layer 107 formed on the first insulation layer 103 to cover the first circuit pattern 105, and a second circuit pattern 109 formed on the second insulation layer 107 and including a third pad 109a formed on a location corresponding to the first pad 105a and a fourth pad 109b spaced apart from the third pad 109a.

In this regard, the metal layer 101 may include one selected from a group consisting of aluminum (Al), copper (Cu), iron (Fe), and titanium (Ti) but the present embodiment is not particularly limited thereto. Any metals having highly thermal conductivity may be used.

In the present embodiment, the metal layer 101 is formed to improve a heat resistance characteristic of the substrate 110. In a case where a high heat resistance characteristic is not required, the metal layer 101 may not be formed.

In the present embodiment, the first insulation layer 103 and the second insulation layer 107 may be formed of a liquid insulation material or a film insulation material but the present invention is not particularly limited thereto.

In this regard, the insulation material may be a resin insulation material that may include any one selected from a group consisting of, more specifically, epoxy, polyimide (PI), liquid crystal polymer (LCP), phenol resin, bismalemide triazine (BT) resin, and combinations thereof but the present invention is not particularly limited thereto.

Also, in the present embodiment, the first insulation layer 103 and the second insulation layer 107 may include an inorganic filler (not shown).

The inorganic filler (not shown) improves the heat dissipation characteristic of the first insulation layer 103 and the second insulation layer 107, and may include any one selected from a group consisting of oxide aluminum ($Al_2O_3$), nitride aluminum (AlN), nitride boron (BN), oxide silicon ($SiO_2$), carbon silicon (SiC), and combinations thereof but the present invention is not particularly limited thereto.

In the present embodiment, the first circuit pattern 105 and the second circuit pattern 109 may be formed by stacking a patterned metal film or a patterned lead frame on the first insulation layer 103 and the second insulation layer 107, respectively, and through a plating process, but the present invention is not particularly limited thereto.

In this regard, the first circuit pattern 105 and the second circuit pattern 109 may include any one selected from a group consisting of copper (Cu), iron (Fe), and copper-nickel (Fe—Ni) alloy, but the present invention is not particularly limited thereto.

In the present embodiment, as shown in FIG. 1, the first circuit pattern 105 may include the first pad 105a and the second pad 105b spaced apart from the first pad 105a, but the present invention is not particularly limited thereto.

That is, although the first circuit pattern 105 includes the two pads 105a and 105b in FIG. 1, this is merely an example, and the first circuit pattern 105 may include three or more pads spaced apart from each other.

Also, in the present embodiment, as shown in FIG. 1, the second circuit pattern 109 may include the third pad 109b formed in a location corresponding to the first pad 105a of the first circuit pattern 105 and the fourth pad 109a spaced apart from the third pad 109b, but the present invention is not particularly limited thereto.

That is, as described above, although the second circuit patterns 109 includes the two pads 109a and 109b in FIG. 1, the second circuit pattern 109 may include three or more pads spaced apart from each other.

As such, in the present embodiment, the first pad 105a and the third pad 109b may be disposed in parallel to each other, and the second pad 105b and the fourth pad 109a may be disposed in parallel to each other with the second insulation layer 107 therebetween.

In this regard, the first pad 105a and the third pad 109b, and the second pad 105b and the fourth pad 109a may have different areas.

More specifically, the third pad 109b may be greater than the first pad 105a, and, to the contrary, the third pad 109b may be smaller than the first pad 105a. Likewise, the fourth pad 109a may be greater than the second pad 105b, and, to the contrary, the fourth pad 109a may be smaller than the second pad 105b.

Also, the first pad 105a and the third pad 109b, and the second pad 105b and the fourth pad 109a may have the same shape or different shapes.

Also, the first pad 105a and the third pad 109b, and the second pad 105b and the fourth pad 109a may have different polarities.

For example, the first pad 105a may be implemented to have a positive (+) polarity, and the third pad 109b may be implemented to have a negative (−) polarity, and, to the contrary, the first pad 105a may be implemented to have the negative (−) polarity, and the third pad 109b may be implemented to have the positive (+) polarity.

Likewise, the second pad 105b may be implemented to have the positive (+) polarity, and the fourth pad 109a may be implemented to have the negative (−) polarity, and, to the contrary, the second pad 105b may be implemented to have the negative (−) polarity, and the fourth pad 109a may be implemented to have the positive (+) polarity.

Figure 3:
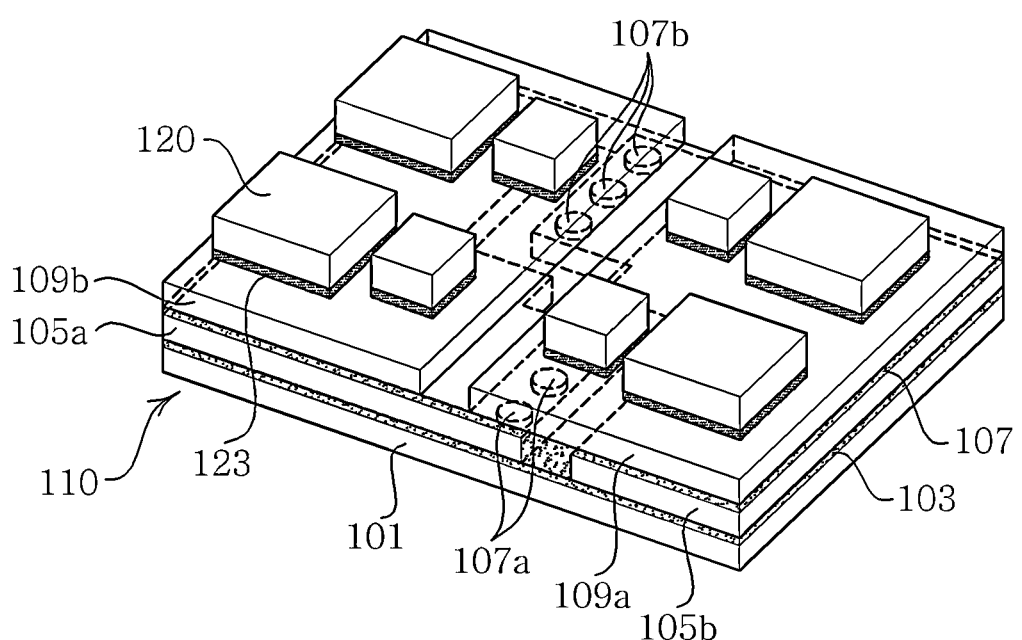
FIG. 3 is a perspective view of a structure of a substrate of the power module packages according to the first and second embodiments of the present invention.

In this regard, as shown in FIG. 3, the first pad 105a and the fourth pad 109a, and the second pad 105b and the third pad 109b are connected to each other through a first via 107a and a second via 107b, respectively, and thus the first pad 105a and the fourth pad 109a, and the second pad 105b and the third pad 109b have the same polarity, but the present invention is not particularly limited thereto.

More specifically, for example, if the first pad 105a has the positive (+) polarity, the fourth pad 109a connected to the first pad 105a through the first via 107a may also have the positive (+) polarity.

Also, the third pad 109b disposed in parallel to and spaced apart from the first pad 105a have the negative (−) polarity opposite to the first pad 105a, and the second pad 105b connected to the third pad 109b through the second via 107b may also have the negative (−) polarity. As a result, the first pad 105a and the third pad 109b, and the second pad 105b and the fourth pad 109a may be implemented to have different polarities.

As such, the first pad 105a and the third pad 109b, and the second pad 105b and the fourth pad 109a that are disposed in parallel to and spaced apart from each other with the second insulation layer 107 therebetween are implemented to have different polarities, and thus a decoupling capacitor structure may be formed between the first pad 105a and the third pad 109b, and the second pad 105b and the fourth pad 109a.

In this regard, a decoupling capacitor is disposed around a semiconductor chip and is used to remove noise due to a power supply and switching.

Accordingly, the decoupling capacitor structure is formed in the substrate 110 in which a semiconductor chip 120 is mounted, thereby advantageously preventing noise occurring due to the power supply to the semiconductor chip 120 mounted on the substrate 110 and an operation of the semiconductor chip 120 from radiating and propagating.

Also, in the present embodiment, the second circuit pattern 109 may, more specifically, mount the semiconductor chip 120 in the third pad 109b and the fourth pad 109a.

In this regard, a bonding layer 123 may be formed between the semiconductor chip 120 and the third pad 109b and the fourth pad 109a. The bonding layer 123 may be formed of a solder or conductive epoxy having a relatively high thermal conductivity in order to effectively dissipate heat, but the present invention is not particularly limited thereto.

Also, in the present embodiment, the semiconductor chip 120 and the substrate 110, and external connection terminals 130a and 130b and a wire 121 may be electrically connected to each other, but the present invention is not particularly limited thereto.

In this regard, a wire bonding process may be performed by ball bonding, wedge bonding, and stitch bonding that are widely known to the art to which the invention pertains, but the present invention is not particularly limited thereto.

In this regard, the wire 121 may use aluminum (Al), gold (Au), copper (Cu), etc., but the present invention is not particularly limited thereto. In general, a wire that applies a high rating voltage to the semiconductor chips 120a and 120b that are power devices is formed of aluminum (Al). A thick wire must be used to endure a high voltage. In this connection, it is effective to use aluminum (Al) rather than gold (Au) or copper (Cu) in terms of a cost reduction.

In the present embodiment, the semiconductor chip 120 may be the power device, but the present invention is not particularly limited thereto.

The power device may include silicon controlled rectifier (SCR), a power transistor, an insulated gate bipolar transistor (IGBT), a Morse transistor, a power rectifier, a power regulator, an inverter, a converter, or a high power semiconductor chip of a combination of theses or diode.

In general, the power device instant high current periodically may flow. As described above, the decoupling capacitor structure is formed in the substrate 110, and thus a stable ground GND is provided to the power device, thereby stabling a reference electric potential and preventing a high frequency current from propagating.

Also, in the present embodiment, the external connection terminals 130a and 130b may have one end and another end, one end electrically connecting to the semiconductor chip 120 and another end protruding to the outside.

The external connection terminals 130a and 130b are electrically connected to an external driving IC or a separate external apparatus so as to drive the semiconductor chip 120 mounted on the substrate 110, and may be a lead frame in the present embodiment, but the present invention is not particularly limited thereto.

Also, the second circuit pattern 109 may further include an external connection pad 109c spaced apart from the third pad 109b and the fourth pad 109a. The external connection pad 109c may contact one ends of the external connection terminals 130a and 130b, but the present invention is not particularly limited thereto.

For example, as shown in FIG. 1, one end of the external connection terminal 130a may be bonded to the external connection pad 109c, and, one end of the external connection terminal 130b may not contact the substrate 110 but may be implemented to be connected to an electrode (not shown) of the semiconductor chip 120 directly through the wire bonding.

Also, although the external connection terminal 130a is implemented in a down-set shape in FIG. 1, the present invention is not particularly limited thereto, and the external connection terminal 130a cannot be also implemented in the down-set shape.

Second Embodiment

Figure 2:
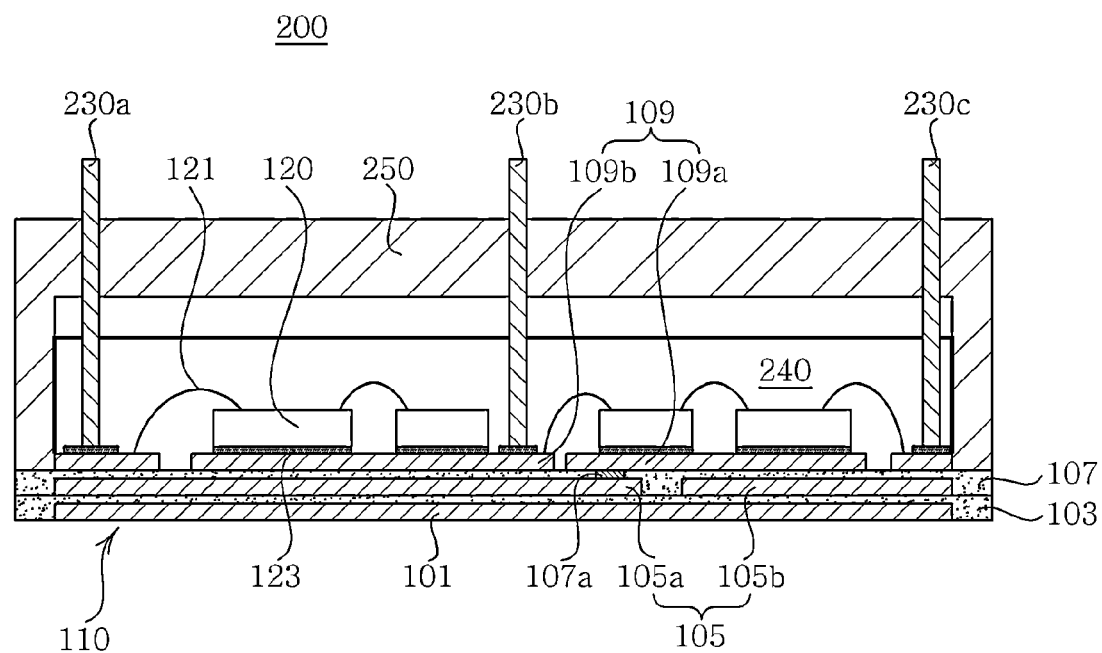
FIG. 2 is a cross-sectional view of a structure of a power module package according to a second embodiment of the present invention.

FIG. 2 is a cross-sectional view of a structure of a power module package 200 according to a second embodiment of the present invention.

Redundant descriptions between the first embodiment and the second embodiment will be omitted here, and the same reference numerals will denote the same elements therebetween.

Referring to FIG. 2, the power module package 200 according to the present embodiment may include the substrate 110, the semiconductor chip 120 mounted on the substrate 110, external connection terminals 230a, 230b, and 230c bonded onto the substrate 110, and a case 250 covering an upper portion of the substrate 110 and the semiconductor chip 120.

In the present embodiment, as described in the first embodiment, the substrate 110 may include the metal layer 101, the first insulation layer 103 formed on the metal layer 101, the first circuit pattern 105 formed on the first insulation layer 103 and including the first pad 105a and the second pad 105b spaced apart from the first pad 105a, the second insulation layer 107 formed on the first insulation layer 103 to cover the first circuit pattern 105, and the second circuit pattern 109 formed on the second insulation layer 107 and including the third pad 109a formed on a location corresponding to the first pad 105a and the fourth pad 109b spaced apart from the third pad 109a.

In this regard, the first circuit pattern 105 may include the first pad 105a and the second pad 105b spaced apart from the first pad 105a, and the second circuit pattern 109 may include the third pad 109b formed in parallel in a location corresponding to the first pad 105a and the fourth pad 109a spaced apart from the third pad 109b, but the present invention is not particularly limited thereto.

In this regard, the first pad 105a and the third pad 109b, and the second pad 105b and the fourth pad 109a have different polarities, and the first pad 105a and the fourth pad 109a and the third pad 109b and the second pad 105b may have the same polarity, but the present invention is not particularly limited thereto.

As such, the first pad 105a and the third pad 109b, and the second pad 105b and the fourth pad 109a may be disposed in parallel to and spaced apart from each other may be implemented to have different polarities with the second insulation layer 107 therebetween, and a decoupling capacitor structure may be formed between the first pad 105a and the third pad 109b and between the second pad 105b and the fourth pad 109a, thereby advantageously preventing noise occurring due to a power supply to the semiconductor chip 120 mounted on the substrate 110 and an operation of the semiconductor chip 120 from radiating and propagating.

In the present embodiment, the external connection terminals 230a, 230b, and 230c may have pin shapes as shown in FIG. 2, but the present invention is not particularly limited thereto.

The external connection terminals 230a, 230b, and 230c in pin shapes may be used rather than conventional lead frames disposed in a boundary part of the substrate 110, and thus the external connection terminals 230a, 230b, and 230c can be freely disposed and simultaneously disposed in the substrate 110, thereby advantageously achieving the small-sized power module package 200.

Also, in the present embodiment, the external connection terminals 230a, 230b, and 230c may have one end and another end, one end electrically connecting to the semiconductor chip 120 and another end protruding to the outside.

Also, in the present embodiment, the case 250 may be formed on the substrate 110.

As shown in FIG. 2, the case 250 may be formed on the substrate 110 and cover an upper portion of the substrate 110 and the semiconductor chip 120.

Also, in the present embodiment, insertion holes 250a into which another end of the external connection terminals 230a, 230b, and 230c are inserted may be formed in the case 250.

Also, the power module package 200 according to the present embodiment may further include a sealing member 240 formed to cover the upper portion of the substrate 110 and the semiconductor chip 120 in the case 250.

In this regard, the sealing member 240 may use a silicone gel or an epoxy molding compound (EMC), but the present invention is not particularly limited thereto.

According to the present invention, a P electrode pattern and an N electrode pattern are disposed in parallel to each other in a substrate in which a semiconductor chip is mounted, and thus a condenser structure having a decoupling capacitor function is formed, thereby obtaining an effect of preventing noise in a module from radiating and propagating.

Further, according to the present invention, the substrate in which the semiconductor chip is mounted is formed to include a three-layer metal layer, thereby obtaining an effect of effectively dissipating heat generated from the semiconductor chip.

Furthermore, according to the present invention, the substrate in which the P electrode pattern and the N electrode pattern are perpendicularly disposed in parallel to each other, and thus a stable ground GND is provided to a power module in which an instant high current periodically flows, thereby stabling a reference electric potential and preventing a high frequency current from propagating.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A power module package, comprising:
a substrate including a metal layer, a first insulation layer formed on the metal layer, a first circuit pattern formed on the first insulation layer and including a first pad and a second pad spaced apart from the first pad, a second insulation layer formed on the first insulation layer to cover the first circuit pattern, and a second circuit pattern formed on the second insulation layer and including a third pad formed on a location corresponding to the first pad and a fourth pad spaced apart from the third pad;
to a semiconductor chip mounted on the second circuit pattern; and
an external connection terminal having one end and another end, one end being electrically connected to the semiconductor chip, and another end protruding from the outside,
wherein the first pad and the third pad, and the second pad and the fourth pad have different polarities.

2. The power module package as set forth in claim 1, wherein the first pad and the fourth pad, and the second pad and the third pad have the same polarity.

3. The power module package as set forth in claim 1, wherein the substrate includes:
a first via formed to electrically connect the first pad and the fourth pad; and
a second via formed to electrically connect the second pad and the third pad.

4. The power module package as set forth in claim 1, further comprising:
a sealing member formed to surround the semiconductor chip from both sides in a thickness direction of the substrate.

5. The power module package as set forth in claim 1, wherein the second circuit pattern includes an external connection pad spaced apart from the third pad and the fourth pad,
wherein one end of the external connection terminal contacts the external connection pad.

6. The power module package as set forth in claim 1, wherein the external connection terminal is a lead frame.

7. The power module package as set forth in claim 1, wherein the first insulation layer and the second insulation layer include resin insulation materials including inorganic fillers.

8. A power module package, comprising:
- a substrate including a metal layer, a first insulation layer formed on the metal layer, a first circuit pattern formed on the first insulation layer and including a first pad and a second pad spaced apart from the first pad, a second insulation layer formed on the first insulation layer to cover the first circuit pattern, and a second circuit pattern formed on the second insulation layer and including a third pad formed on a location corresponding to the first pad and a fourth pad spaced apart from the third pad;
- a semiconductor chip mounted on the second circuit pattern;
- an external connection terminal having one end and another end, one end being electrically connected to the semiconductor chip, and another end protruding from the outside; and
- a case formed on the substrate and covering an upper portion of the substrate and the semiconductor chip,
- wherein the first pad and the third pad, and the second pad and the fourth pad have different polarities.

9. The power module package as set forth in claim 8, wherein the first pad and the fourth pad, and the second pad and the third pad have the same polarity.

10. The power module package as set forth in claim 8, wherein the substrate includes:
- a first via formed to electrically connect the first pad and the fourth pad; and
- a second via formed to electrically connect the second pad and the third pad.

11. The power module package as set forth in claim 8, wherein the second circuit pattern includes an external connection pad spaced apart from the third pad and the fourth pad,
- wherein one end of the external connection terminal contacts the external connection pad.

12. The power module package as set forth in claim 8, wherein the first insulation layer and the second insulation layer include resin insulation materials including inorganic fillers.

13. The power module package as set forth in claim 8, wherein the case includes an insertion hole formed to insert another end of the external connection terminal.

14. The power module package as set forth in claim 8, further comprising:
- a sealing member formed to cover the upper portion of the substrate and the semiconductor chip in the case.

15. The power module package as set forth in claim 8, wherein the external connection terminal has a pin shape.

* * * * *